(12) United States Patent
Senatori

(10) Patent No.: US 10,040,245 B2
(45) Date of Patent: Aug. 7, 2018

(54) FORMING A HOUSING ASSEMBLY

(71) Applicant: HEWLETT-PACKARD DEVELOPMENT COMPANY, L.P., Houston, TX (US)

(72) Inventor: Mark David Senatori, Austin, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/172,114

(22) Filed: Jun. 2, 2016

(65) Prior Publication Data
US 2016/0279864 A1    Sep. 29, 2016

Related U.S. Application Data

(62) Division of application No. 13/825,046, filed as application No. PCT/US2011/022160 on Jan. 21, 2011, now Pat. No. 9,363,912.

(51) Int. Cl.
*B29C 65/00* (2006.01)
*B29C 65/54* (2006.01)
(Continued)

(52) U.S. Cl.
CPC ............ *B29C 65/54* (2013.01); *G06F 1/1633* (2013.01); *G06F 1/1637* (2013.01);
(Continued)

(58) Field of Classification Search
CPC .... G06F 1/1633; G06F 1/1637; G06F 1/1656; H05K 5/03; H05K 5/062; B32B 37/1284;
(Continued)

(56) References Cited

U.S. PATENT DOCUMENTS 4,808,898 A * 2/1989 Pearson ................. B25J 9/1015
294/119.1
5,186,999 A    2/1993 Brambach
(Continued)

FOREIGN PATENT DOCUMENTS

CN       201662739         12/2010
DE   102007060760 A1 *  6/2009  ............... F16J 15/14
(Continued)

OTHER PUBLICATIONS

PCT; "Notification of Transmittal of the International Search Report and the Written Opinion of the International Searching Authority, or the Declaration"; PCT/US2011/022160; dated Sep. 29, 2011; 9 pages.
(Continued)

*Primary Examiner* — John L Goff, II
(74) *Attorney, Agent, or Firm* — HPI Patent Department

(57) ABSTRACT

In some examples, a method of forming a housing assembly comprises affixing a support frame onto a first panel cover of the housing assembly, wherein the support frame includes an integrated pattern of channel cavities, positioning a second panel cover of the housing assembly adjacent the support frame, and flowing a bonding material through a plurality of openings of the second panel cover and into the channel cavities of the integrated pattern of the support frame so as to form a secure bond between the first panel cover, the support frame, and the second panel cover of the housing assembly.

8 Claims, 7 Drawing Sheets

(51) Int. Cl.
  *G06F 1/16* (2006.01)
  *H05K 5/03* (2006.01)
  *B29K 705/00* (2006.01)
  *B29K 709/08* (2006.01)
  *B29L 31/34* (2006.01)

(52) U.S. Cl.
  CPC ............ *G06F 1/1656* (2013.01); *H05K 5/03* (2013.01); *B29K 2705/00* (2013.01); *B29K 2709/08* (2013.01); *B29L 2031/3481* (2013.01); *Y10T 428/24339* (2015.01)

(58) Field of Classification Search
  CPC .. B32B 37/1292; B32B 37/0076; F16J 15/14; B29C 65/54; B29C 65/542; B29C 65/546; B29C 65/544; B29C 65/548
  USPC ........................................................ 156/305
  See application file for complete search history.

(56) References Cited

U.S. PATENT DOCUMENTS

| | | | |
|---|---|---|---|
| 5,503,486 | A | 4/1996 | Zane |
| 7,695,665 | B2 | 4/2010 | Zadesky et al. |
| 8,091,314 | B2 | 1/2012 | Polk, Jr. et al. |
| 2004/0011949 | A1* | 1/2004 | Bluemcke ................ G01V 8/10 250/239 |
| 2005/0007485 | A1* | 1/2005 | Vook .................... H04N 5/2254 348/345 |
| 2007/0247801 | A1 | 10/2007 | Bekele |
| 2007/0261787 | A1* | 11/2007 | Malis .................... B29C 65/542 156/285 |
| 2008/0032093 | A1 | 2/2008 | Deng et al. |
| 2008/0125960 | A1* | 5/2008 | Wipplinger .......... G01C 23/005 701/455 |
| 2009/0218725 | A1 | 9/2009 | Thelemann et al. |
| 2010/0054493 | A1 | 3/2010 | Lin et al. |
| 2010/0078343 | A1 | 4/2010 | Hoellwarth et al. |
| 2010/0110629 | A1 | 5/2010 | Dietz et al. |
| 2010/0258458 | A1* | 10/2010 | Nommer .................. F16J 15/14 206/305 |
| 2016/0299535 | A1 | 10/2016 | Senatori |

FOREIGN PATENT DOCUMENTS

| | | | |
|---|---|---|---|
| JP | 04345195 | A * | 12/1992 |
| JP | 06089085 | A * | 3/1994 |
| TW | 340702 | | 9/1998 |
| TW | 420969 | | 2/2001 |
| TW | 200809462 | | 2/2008 |

OTHER PUBLICATIONS

TW Office Action dated Nov. 8, 2013 issued in Appl. No. 100146175; 12 pages.

U.S. Appl. No. 5/172,106, Non-Final Rejection dated Apr. 10, 2017, pp. 1-4 and attachments.

* cited by examiner

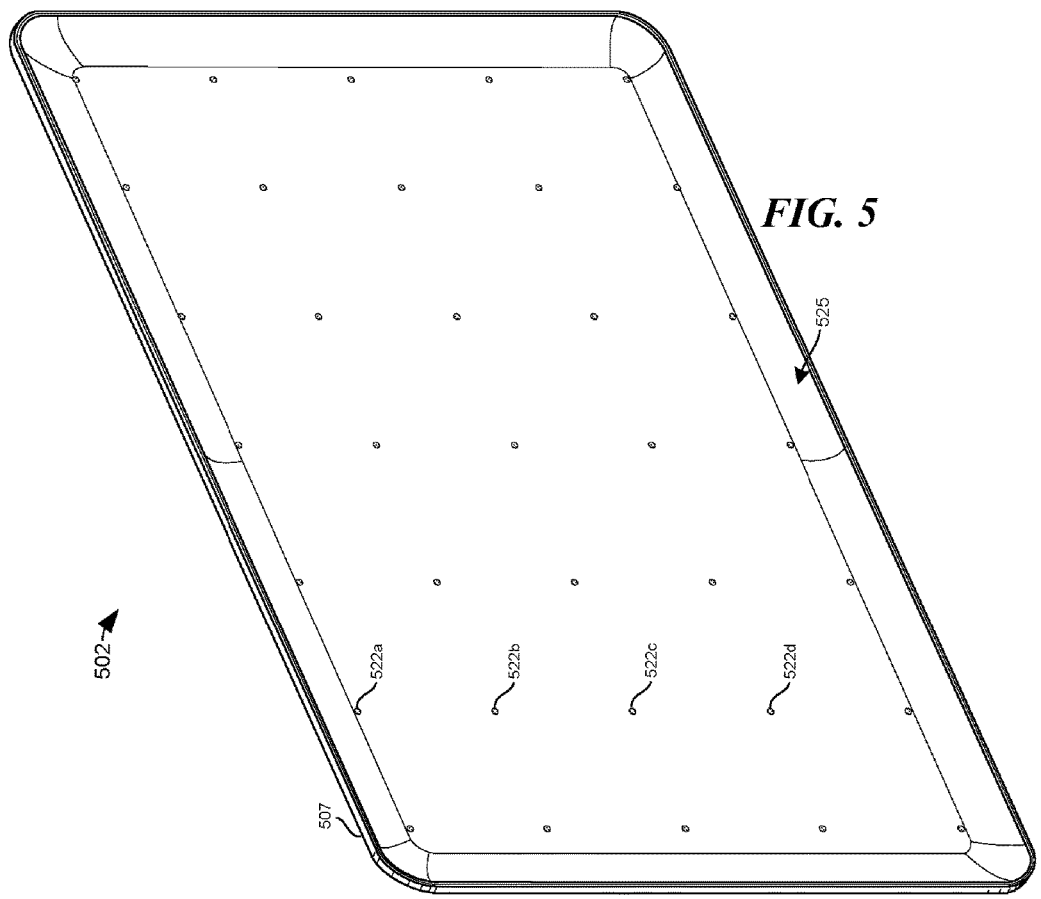

FORMING A HOUSING ASSEMBLY

CROSS REFERENCE TO RELATED APPLICATIONS

This is a divisional of U.S. application Ser. No. 13/825,046, filed Mar. 19, 2013, now U.S. Pat No. 9,363,912, which is a national stage application under 35 U.S.C. § 371 of PCT/US2011/022160, filed Jan. 21, 2011, which are both hereby incorporated by reference in their entirety.

BACKGROUND

The emergence and popularity of mobile computing has made portable electronic devices, due to their compact design and light weight, a staple in today's marketplace. Many portable electronic devices such as notebook computers, netbooks, tablet personal computers, and handheld devices employ a casing or housing for protecting critical internal electrical components. However, one main drawback of these portable computers is that due to their size and inherent fragileness, the housing or casings are unable to consistently and effectively withstand rugged transportation conditions or accidental drops by the user.

BRIEF DESCRIPTION OF THE DRAWINGS

FIG. 4A is a cut-away view of a partially assembled housing assembly, while

FIG. 5 is a three-dimensional perspective view of the housing assembly according to an example of the present invention.

DETAILED DESCRIPTION

Figure 1A:
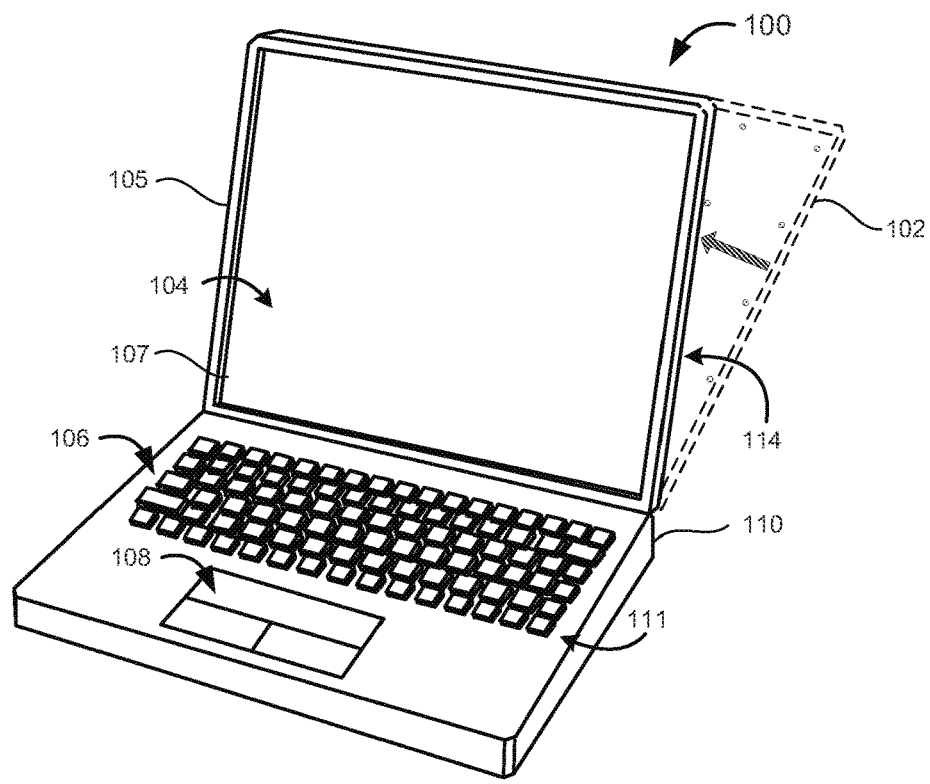
FIGS. 1A and 1B are three-dimensional perspective views of a portable electronic device implementing the housing assembly in accordance with an example of the present invention.

The following discussion is directed to various embodiments. Although one or more of these embodiments may be discussed in detail, the embodiments disclosed should not be interpreted, or otherwise used, as limiting the scope of the disclosure, including the claims. In addition, one skilled in the art will understand that the following description has broad application, and the discussion of any embodiment is meant only to be an example of that embodiment, and not intended to intimate that the scope of the disclosure, including the claims, is limited to that embodiment. Furthermore, as used herein, the designators "A", "B" and "N" particularly with respect to the reference numerals in the drawings, indicate that a number of the particular feature so designated can be included with examples of the present disclosure. The designators can represent the same or different numbers of the particular features.

The FIGURES herein follow a numbering convention in which the first digit or digits correspond to the drawing figure number and the remaining digits identify an element or component in the drawing. Similar elements or components between different figures may be identified by the user of similar digits. For example, 143 may reference element "43" in FIG. 1, and a similar element may be referenced as 243 in FIG. 2. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

Prior solutions to the aforementioned problem utilize a single cover panel formed with a thin plastic backing plate for providing rigidity. Without a second metal cover, however, the plastic backing plate has a tendency to deform under a heavy load. As a result, there is a need for a more robust and durable panel housing assembly.

Examples of the present invention disclose a molding process for creating a complex structural sandwich assembly for a panel cover or other housing part. According to one example, two thin metal covers are spaced apart by a lightweight plastic lattice that holds the two metal covers parallel to each other. More particularly, the molding process of the present examples combines two methods with four integral steps into one operation to produce a finished assembly without any additional molding operations. Stated differently, the process needed to create the housing assembly in accordance with examples of the present invention is completed within one molding cycle. This method of construction creates a very strong and lightweight panel cover assembly that can withstand very high stresses and is ideal for ruggedized notebooks.

Figure 1B:
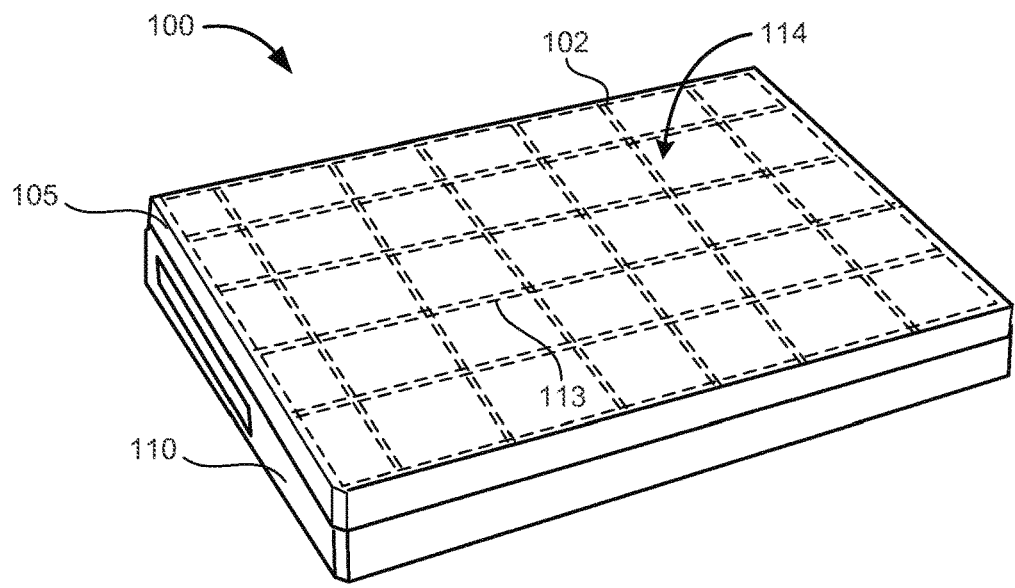

Referring now in more detail to the drawings in which like numerals identify corresponding parts throughout the views, FIGS. 1A and 1B are three-dimensional perspective views of a portable electronic device implementing the housing assembly in accordance with an example of the present invention. As shown here, a notebook computer 100 represents the mobile electronic device and includes an upper housing 105 and a base housing 110. The upper housing, or display panel housing 105, includes a display device 107 having electrical wiring adapted to provide graphical display to a user on its front surface side 104. Furthermore, the base housing 110 includes a top surface side 111 having user input mechanisms such as a keyboard 106 and touch pad 108. According to the present example, a panel housing assembly 102 is formed on a rear side 114 opposite the front surface side 104 of the display panel 105. The panel housing assembly 102 including fixing mechanisms for securely attaching onto the rear side 114 of the display panel 105.

FIG. 1B is a three-dimensional view of the portable computer in a closed position. As shown here, the base housing 110 and display panel housing 105 are in a closed position in which the display panel housing 105 is vertically-adjacent and substantially aligned with the base housing 110. In particular, the front surface side 104 of the display panel housing 105 covers the front surface side 111 of the base housing 110 including the keyboard 106 and touchpad 108 areas. According to one example, the panel housing assembly 102 is formed on a rear surface side 114 (i.e. side opposite the front surface side 104 shown in FIG. 1A) of the display housing 105. Moreover, a lattice support frame 113 is formed within the panel assembly housing 102 as will be described in further detail with respect to FIGS. 2-5.

Figure 2:
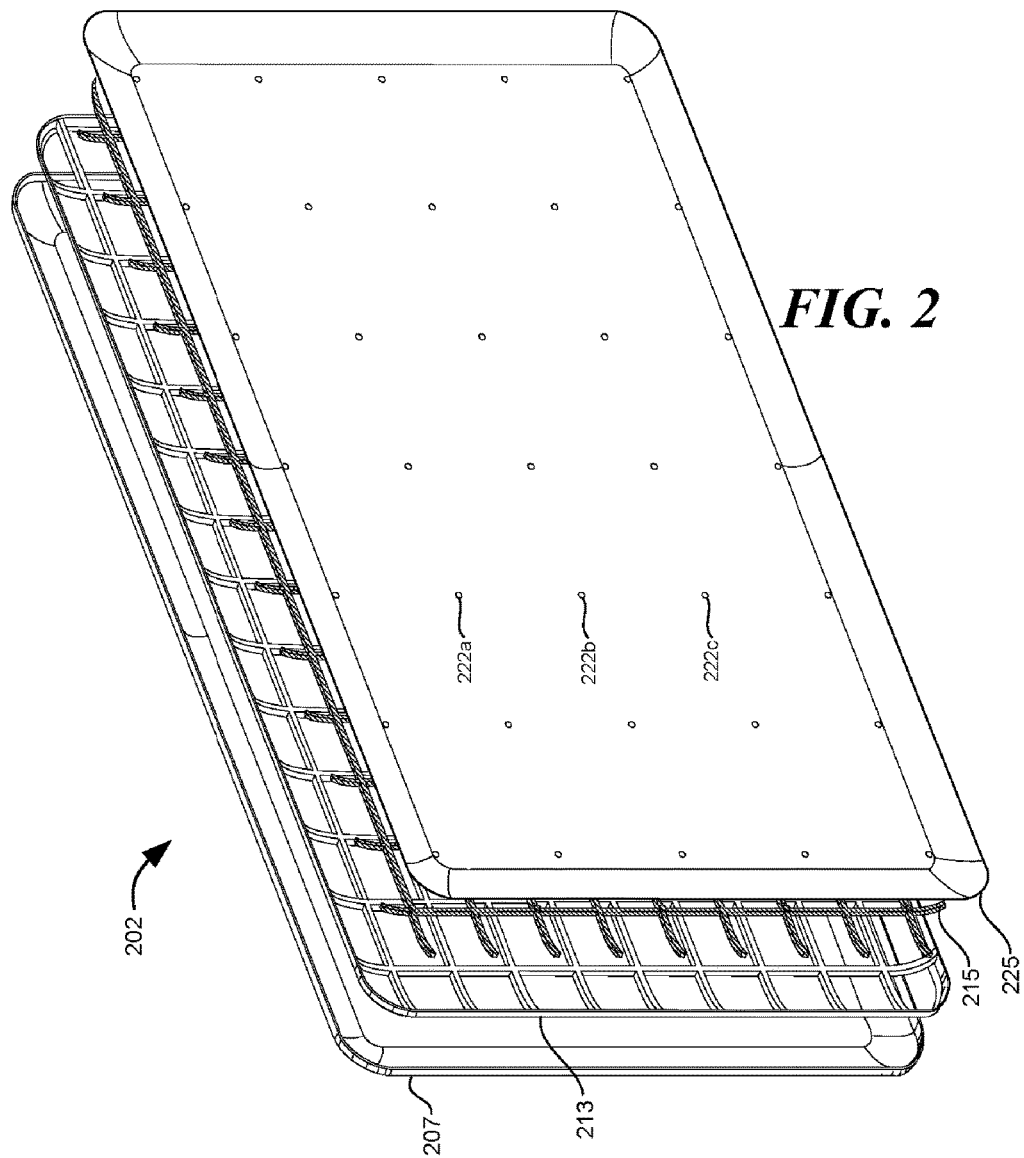
FIG. 2 is a three-dimensional exploded view of the housing assembly according to an example of the present invention.

FIG. 2 is a three-dimensional exploded view of the housing assembly according to an example of the present invention. In the following example, the panel housing assembly includes four layers including an outer panel cover 207, a lattice support frame 213, bonding material 215, and an inner panel cover 225. Both the outer panel cover 207 and the inner panel cover 225 may be formed of a rigid material such as metal or glass for example. According to one example, the outer panel cover 207 is formed to be thicker is size than the inner panel cover 225. Furthermore, the inner panel cover 225 includes a plurality of small openings or apertures 222a-222c for insertion of the bonding material 215 as will be described in detail below. According to one example, the lattice support frame 213 may be formed of a polymer material having high molecular mass such as plastic or rubber for example. Furthermore, the support frame 213 includes a plurality of runners and channels so as to form a lattice, or criss-crossed patterned, support structure with an inner pattern cavity 316 similar to an I-beam support structure.

Figure 3:
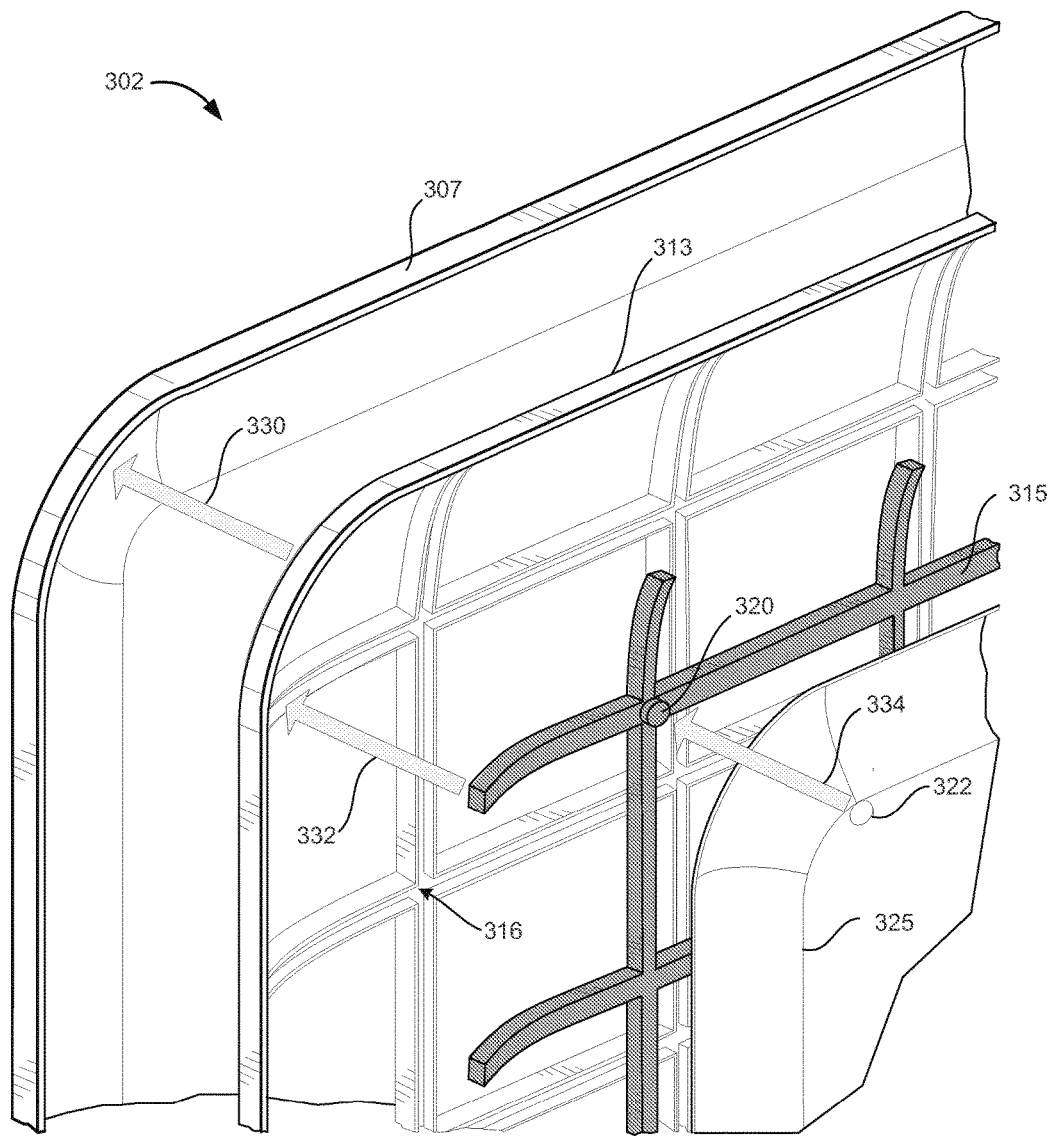
FIG. 3 is a partial three-dimensional exploded view of the housing assembly according to an example of the present invention.

FIG. 3 is a partial three-dimensional exploded view of the housing assembly according to an example of the present invention. As in the previous example, the panel assembly 302 includes an outer panel cover 307, lattice support frame 313, bonding material 315, and inner panel cover 325. The lattice support frame 313 is formed of a sufficient size to fit firmly within the outer panel cover 307 as indicated by the directional arrow 330. The pattern of bonding material 315 is formed through insertion of the bonding material through the openings 322 (corresponding to protrusion 320 and directional arrow 334) of the inner panel cover 325 such that the bonding material 315 flows through the runners and channels of the support frame 313. That is, the bonding material 315 is formed and positioned within the pattern cavity 316 of the support frame 313 as indicated by directional arrow 332.

Figure 4A:
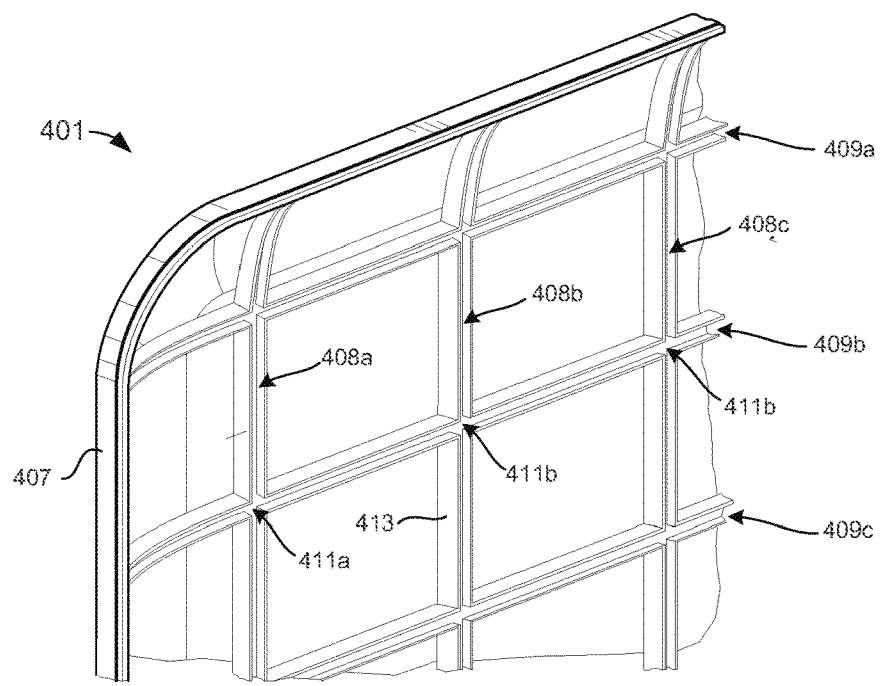
Figure 4B:
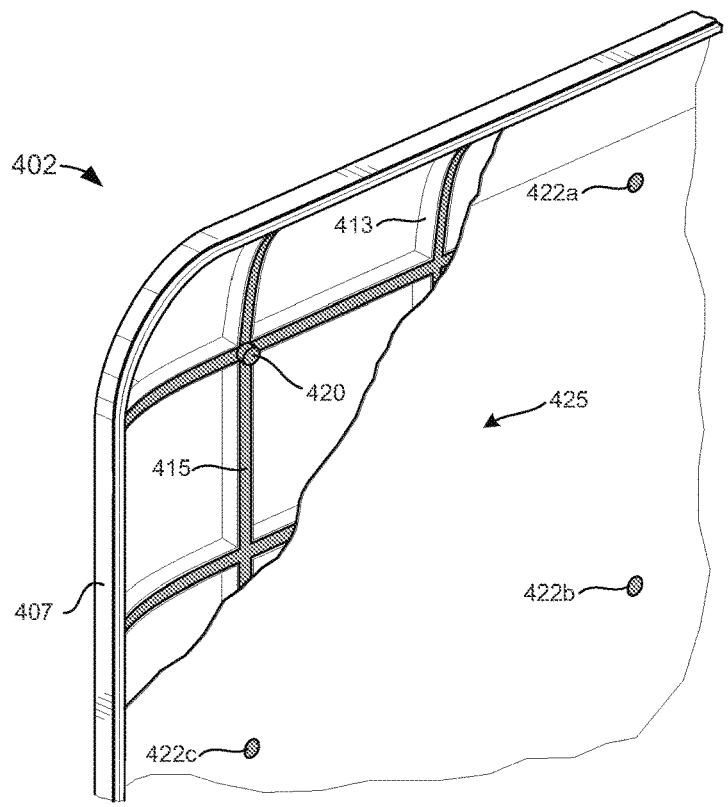
FIG. 4B is a cut-away view of a completely assembled housing assembly according to an example of the present invention.

FIG. 4A is a cut-away view of a partially assembled housing assembly, while FIG. 4B is a cut-away view of a completely assembled housing assembly according to an example of the present invention. As shown in FIG. 4A, a first integrated assembly operation includes positioning of the lattice support frame 413 within the outer panel cover 407 so as to form a first assembly portion 401. The lattice support frame 413 includes a plurality of parallel vertical runners 408a-408c and a plurality of parallel horizontal channels 409a-409c that intersect at a plurality of intersection points 411a-411c thus forming a grid-type pattern as shown in FIG. 4A. Furthermore, both the plurality of runners 408a-408c and the plurality of channels 409a-409c are formed with an inner depth or hollow area (i.e. pattern cavity) for receiving the bonding material as will be described in further detail with reference to the second assembly operation of FIG. 4B.

Referring now to FIG. 4B, a second assembly operation is performed so as to create a completed panel housing assembly 402. More specifically, the inner panel cover 425 is positioned adjacent to the support frame 413 and the outer panel cover 407 such that the plurality of apertures 422a-422c align with the integrated pattern (i.e. channels/runners) of the support frame 413. Once the inner panel cover is properly positioned and aligned, the bonding material 415 is reverse injected through the plurality of apertures 422a-422c of the inner panel cover so as to flow through/into the plurality of vertical runners 408a-408c and the plurality of horizontal channels 409a-409c of the support frame 413. As a result, the bonding material 415 creates an adhesive bond with the outer panel cover 407 and the support frame 413 in addition to the inner panel cover 425 through which it was injected. Accordingly, the completed molding process provides a durable and structural sandwich-type housing assembly.

FIG. 5 is a three-dimensional perspective view of the housing assembly according to an example of the present invention. As shown here, the housing assembly 502 includes an outer panel cover 507 adjacent to and affixed to an inner panel cover 525. As described above, the inner panel cover 525 includes a plurality of small openings 522a-522d for insertion of bonding material utilized to form a secure bond for all three layers (i.e. outer panel, inner panel, and support frame) of the housing assembly.

Figure 6:
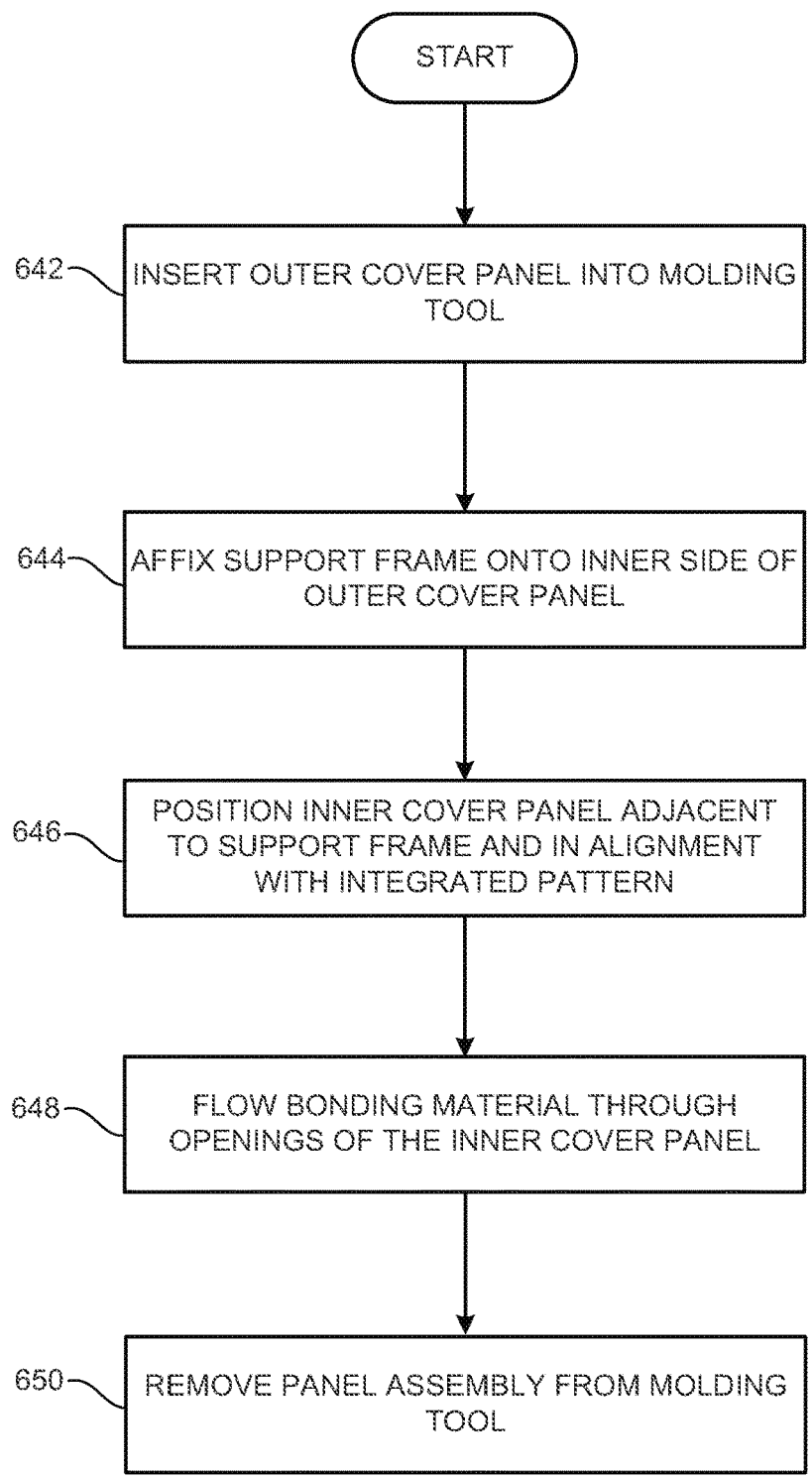
FIG. 6 is flow chart illustrating the manufacturing steps for creating the housing assembly according to an example of the present invention.
Figure 7B:
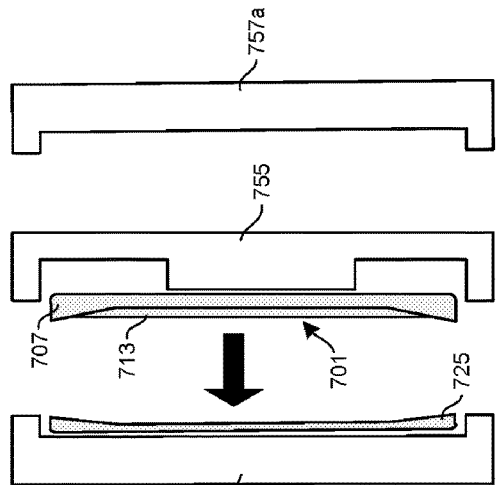
FIGS. 7A-7C are simplified illustrations of the manufacturing process of FIG. 6 in accordance with an example of the present invention.
Figure 7C:
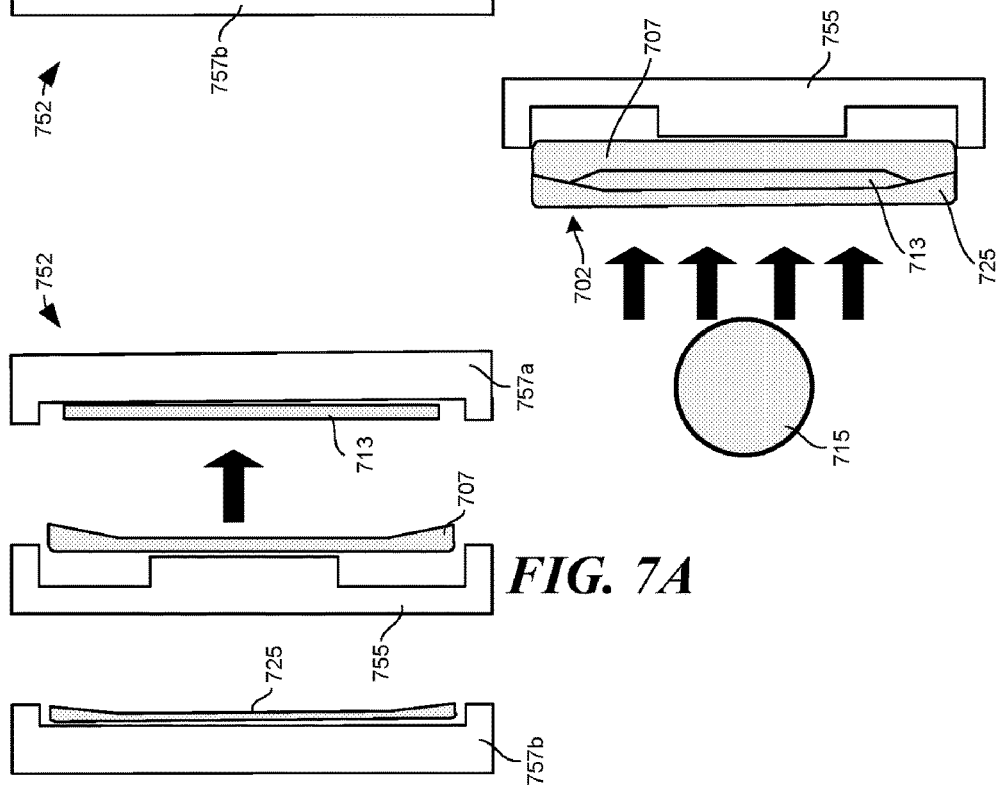
Figure 7A:
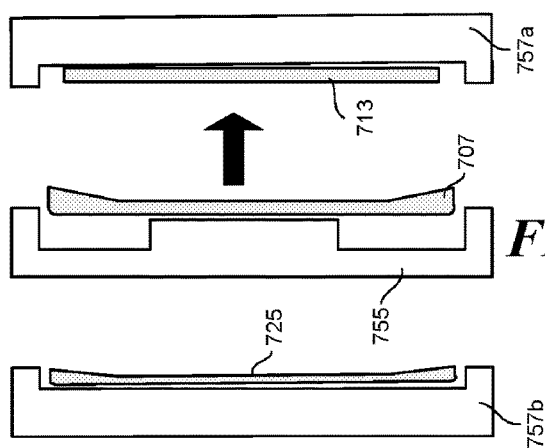

FIG. 6 is flow chart illustrating the manufacturing steps for creating the housing assembly, while FIGS. 7A-7C are illustrations of the manufacturing process outlined in FIG. 6 according to an example of the present invention. In step 642, the outer panel cover (707) is positioned within a cavity side (755) of a molding tool (752) as will be appreciated by one skilled in the art. Next, in step 644 the outer panel cover (707) is then co-molded with the plastic lattice support frame (713), which may be formed on a first core side (757a) of the molding tool (752). More particularly and as indicated by the directional arrow shown in FIG. 7A, the cavity side (755) of the molding tool (752) is pressed against the first core side (757a) of the molding tool. Accordingly, a first integrated assembled portion (701 in FIG. 7B) including the metal panel cover (707) and the plastic lattice support frame (713) is formed in the molding tool (752). According to one embodiment, the cavity side (755) of the molding tool (752) is then pulled back from the first core side (757a) and rotated 180° so that the cavity side (755) now lines up with a second core side (757b) that contains the metal inner panel cover (725) inserted therein. In step 646, the molding tool (752) is then closed together (as indicated by the directional arrow shown in FIG. 7B) so as to position the previously molded integrated assembly portion (701) adjacent to the inner panel cover (725). According to one example, the plurality of openings of the inner panel cover should be in alignment with the intersections (channels/runners) associated with the integrated pattern of the support frame. Thereafter, in step 648, bonding material (715) is flowed through the openings of the inner panel cover (713) and into runners and channels of the lattice support frame as described above. The bonding material (715) bonds together both metal panel covers (707, 725) and the plastic structural lattice support frame (713). In step 650, the completed housing assembly is then removed from the molding tool.

Many advantages are afforded by the housing assembly formed in accordance with examples of the present invention. For instance, the method of formation outlined above allows for a very rigid and lightweight housing assembly. Moreover, the housing assembly of the present examples allows for creation of an inexpensive and complex sandwich assembly thus reducing production costs. Still further, the lattice features of the support frame can be placed very close to each other so that the panel cover can be formed very thin in order to hide any signs of deforming or denting thereon, and thereby further reducing the weight of the housing assembly.

Furthermore, while the invention has been described with respect to exemplary embodiments, one skilled in the art will recognize that numerous modifications are possible. For example, although exemplary embodiments depict a notebook computer as the portable electronic device, the invention is not limited thereto. For example, the portable electronic device may be a netbook, a tablet personal computer, a cell phone, or any other electronic device having a casing or housing assembly utilized for protection of internal electrical components.

Furthermore, the support frame may be formed of any type of geometric pattern that provides support for the outer and inner panel covers. For example, the support frame may be formed in a cross-weave or circular pattern. Thus, although the invention has been described with respect to exemplary embodiments, it will be appreciated that the invention is intended to cover all modifications and equivalents within the scope of the following claims.

What is claimed is:

1. A method of forming a housing assembly for an electronic device, the method comprising:
performing a first assembly process comprising:
inserting an outer panel cover into a molding tool;
affixing a support frame onto the outer panel cover using the molding tool, wherein the support frame includes an integrated pattern of channel cavities, wherein affixing the support frame onto the outer panel cover comprises:
pressing a cavity side of the molding tool against a first core side of the molding tool, wherein the cavity side includes the outer panel cover and the first core side includes the support frame;
performing a second assembly process comprising:
positioning, using the molding tool, an inner panel cover adjacent the support frame; and
flowing a bonding material through a plurality of openings of the inner panel cover and into the channel cavities of the integrated pattern of the support frame so as to form a secure bond between the outer panel cover, the support frame, and the inner panel cover.

2. The method of claim 1, wherein the second assembly process further comprises:
rotating the cavity side of the molding tool to face and align with a second core side of the molding tool, wherein the second core side includes the inner panel cover.

3. The method of claim 2, wherein the second assembly process further comprises:
pressing the cavity side of the molding tool against the second core side of the molding tool so as to position the inner panel cover, the outer panel cover, and the support frame in contact with each other.

4. The method of claim 1, wherein the inner panel cover and the outer panel cover are formed of a metal or glass material.

5. The method of claim 1, wherein the support frame is formed of a polymer material.

6. The method of claim 1, wherein positioning the inner panel cover adjacent to the support frame comprises:
aligning the plurality of openings of the inner panel cover with the integrated pattern of channel cavities included in the support frame.

7. The method of claim 6, wherein the channel cavities comprise first channel cavities running along a first direction, and second channel cavities running along a second, different direction, and wherein aligning the plurality of openings of the inner panel cover with the integrated pattern of channel cavities comprises aligning the plurality of openings of the inner panel cover with respective intersections of the first channel cavities and the second channel cavities.

8. The method of claim 7, wherein the first direction is orthogonal to the second direction.

* * * * *